United States Patent [19]

Baird et al.

[11] Patent Number: 5,559,824
[45] Date of Patent: * Sep. 24, 1996

[54] OPTICAL FREQUENCY-CONVERTING MEDIUM PUMPED BY UNSTABLE RESONATOR SEMICONDUCTOR LASER

[75] Inventors: Brian Baird, Oregon City; Richard DeFreez, Hillsboro, both of Oreg.

[73] Assignee: Electro Scientific Industries, Inc., Portland, Oreg.

[*] Notice: The portion of the term of this patent subsequent to May 31, 2011, has been disclaimed.

[21] Appl. No.: 251,475

[22] Filed: May 31, 1994

Related U.S. Application Data

[63] Continuation-in-part of Ser. No. 873,408, Apr. 24, 1992, Pat. No. 5,317,447.

[51] Int. Cl.[6] .................................................... H01S 3/08
[52] U.S. Cl. .................... 372/95; 372/96; 372/102; 372/22; 372/64
[58] Field of Search ........................ 372/95, 75, 92, 372/98, 102, 96

[56] References Cited

U.S. PATENT DOCUMENTS

| | | | |
|---|---|---|---|
| 4,231,838 | 11/1980 | Gier | 156/600 |
| 4,305,778 | 12/1981 | Gier | 156/623 R |
| 4,653,056 | 3/1987 | Baer et al. | 372/27 |
| 4,783,788 | 11/1988 | Gordon | 372/102 |
| 4,803,696 | 2/1989 | Pepper et al. | 372/95 |
| 5,022,043 | 6/1991 | Jacobs | 372/95 |
| 5,036,220 | 7/1991 | Beyer et al. | 372/22 |
| 5,185,752 | 2/1993 | Welch et al. | 372/22 |
| 5,260,963 | 11/1993 | Baird et al. | 372/95 |
| 5,317,447 | 5/1994 | Baird et al. | 372/75 |

OTHER PUBLICATIONS

"High Power, Nearly Diffraction–Limited Output from a Semiconductor Laser with an Unstable Resonator," *IEEE Journal of Quantum Electronics*, 2098–2108, vol. 27, No. 9 (Sept. 1991) by Tilton . . . DeFreez et al.

"Fabrication and Characterization of Planner Ion Gas Exchanged $KTiOPO_4$ Wave Guides for Frequency Doubling," *Applied Physics Letters*, 19–21, vol. 58, No. 1 (Jan. 7, 1991) by Risk.

Dixon, G. J., "Nonlinear Optical Techniques for Frequency Upconversion of Laser Diodes," LEOS '90, IEEE Lasers and Electro–Optics Society Annual Meeting Conference Proceedings, Nov. 4–9, 1990, Boston, MA, U.S. vol. 2, pp. 138–141.

"Miniature Self–Frequency–Doubling CW Nd:YAB Laser Pumped by a Diode–Laser," *Optics Communications*, 3, vol. 77, No. 2 (Jun. 15, 1990) by Schutz et al.

"Generation of 41 mW of Blue Radiation by Frequency Doubling of a GaAlAs Diode Laser," *Applied Physics Letters*, 2291–2293, vol. 56, No. 23 (Jun. 4, 1990) by Kozlovsky et al.

"Diode Laser Pumped Blue–Light Source at 743 nm Using Intracavity Frequency Doubling of a 946 nm Nd"YAG Laser, *Applied Physics Letters*, 1625–1627, vol. 54, No. 17 (Apr. 24, 1989) by Risk, Pon, and Lenth.

(List continued on next page.)

*Primary Examiner*—Leon Scott, Jr.
*Attorney, Agent, or Firm*—Stoel Rives LLP

[57] ABSTRACT

A high-power unstable resonator semiconductor laser (14) emits optical output of greater than 50 mW in a wavelength range of 700–1100 nm. A grating (116,136) may be positioned external to URSL (14) to control the spectral bandwidth and wavelength output of the waveguide pumping beam (74). Alternatively, URSL (14) may be fabricated with a distributed feedback (DFB) grating or a distributed Bragg reflector (DBR). Infrared waveguide pumping beam (74) generated by such a high-power unstable resonator semiconductor laser (14) is coupled into a nonlinear waveguide (28) and converted to visible or near ultraviolet output (100) through the process of second-harmonic generation.

50 Claims, 3 Drawing Sheets

OTHER PUBLICATIONS

"Efficient Second Harmonic Generation of a Diode–Laser––Pumped CW Nd:YAG Laser Using Monolithic MgO:LiNbO$_3$ External Resonant Cavities," *IEEE Journal of Electronics*, 913–919, vol. 24, No. 6 (Jun. 1988) by Kozlovsky et al.

"Second Harmonic and Sum–Frequency Generation to 4950 and 4589 A° in KTP," *IEEE Journal of Quantum Electronics*, 3–4, vol. QE–24, No. 1 (Jan. 1988) by Kato.

"Second Harmonic Generation with Focused Broad–Band and High–Order Transverse Mode Lasers," *IEEE Journal of Quantum Electronics*, 113–117, vol. QE–24, No. 1 (Jan. 1988) by Sun and Lue.

"Room–Temperature, Continuous–Wave, 946–nm Nd:YAG Laser Pumped by Laser–Diode Arrays and Intracavity Frequency Doubling to 473 nm," *Optics Letters*, 993–995, Vol. 12, No. 12 (Dec. 1987) by Risk and Lenth.

"Observations of Self–Focusing of Stripe Geometry Semiconductor Lasers and Development of a Comprehensive Model of Their Operation," *IEEE Journal of Quantum Electronics*, 705–719, vol. QE–13, No. 8 (Aug. 1977) by Kirkby et al.

OPTICAL FREQUENCY-CONVERTING MEDIUM PUMPED BY UNSTABLE RESONATOR SEMICONDUCTOR LASER

This is a continuation-in-part of U.S. patent application Ser. No. 07/873,408, filed Apr. 24, 1992, which will issue as U.S. Pat. No. 5,317,447 on May 31, 1994.

TECHNICAL FIELD

The present invention relates to frequency conveying medium optically pumped by diode lasers and, in particular, to a method and an apparatus for generating second harmonic generation laser output within a 350–550 nm range for use in medical applications, electronic processing, optical reading and recording, and a wide variety of other applications.

BACKGROUND OF THE INVENTION

Certain methods are known for coupling the output of high-power diode lasers into solid-state lasants. Edge-emitting high-power diode lasers are necessarily broad-area devices or arrays of narrow-width diode lasers because the potential for catastrophic optical damage to the mirrors dictates that the optical outputs be limited typically to 10 to 20 mW per micron of emission stripe width. Typical high-power diode lasers used to pump solid-state lasants include aluminum gallium arsenide (AlGaAs) diode lasers. Examples of such diode lasers include Model No. SDL-2480-P1 with continuous wave (CW) output power of 3.0 watts (W) and an emission width of 500 μm; Model No. SDL-2462-P1 with CW output power of 1.0 W and an emission width of 200 μm; and Model No. SDL-2432-P1 with CW output power of 0.5 W and an emission width of 100 μm, all of which are manufactured by Spectra Diode Labs, 80 Rose Orchard Way, San Jose, Calif. Use of AlGaAs semiconductor diode lasers to optically pump solid-state lasers has led to development of compact, solid-state lasers.

Broad-area lasers are described by Thompson in "A Theory for Filamentation in Semiconductor Lasers", *Optoelectronics*, 257–310, vol. 4, (1972) and by Kirkby, et al. in "Observations of Self-Focusing in Stripe Geometry Semiconductor Lasers and Development of a Comprehensive Model of Their Operation," *IEEE Journal of Quantum Electronics*, 705–719, vol. QE-13 (1977). Such broad-area lasers (emission width of typically greater than 5 μm) exhibit a filamentary structure in their optical near-field patterns. The filament structures arise from a nonlinear interaction between the carriers and the optical field in the active area of the laser. The process of stimulated emission effectively reduces the gain profile within the active area and results in an increase in the refractive index in the portion of the active area contributing most strongly to the optical mode. This region of increased refractive index is bounded by regions of the active area that do not contribute so strongly to the optical mode and are characterized by smaller refractive index values. This lateral variation in refractive index in a local region within the active area of the diode laser can form a local lateral index guide.

When the active area is broader than about 5–10 μm, as is the case in typical high-power laser diodes used for solid-state laser pumping, several, or in some cases, many such index-guided regions may form. Stimulated emission within each such lateral index-guided region within the active area may occur in the form of a filament that is only partly spatially coherent or is spatially incoherent with respect to neighboring filaments. This filamentation phenomena is, therefore, a fundamental source of lateral spatial incoherence in high-power laser diodes and, consequently, places limits on the optical brightness obtainable from such devices.

Although such high-power broad area diode lasers have with varying degrees of efficiency been used to optically pump solid-state lasers and to produce useful solid-state laser output at a variety of emission wavelengths, improved methods for coupling the optical output from diode lasers into solid-state lasants are highly desirable.

A method for theoretically obtaining high-power, nearly diffraction-limited optical output from a high-power diode laser has recently been described by Tilton, . . . DeFreez, et al., in "High Power, Nearly Diffraction-Limited Output from a Semiconductor Laser with an Unstable Resonator," *IEEE Journal of Quantum Electronics*, 2098–2108, vol. 27, No. 9, (September 1991). The high-power AlGaAs diode laser described therein demonstrates high power (greater than 1 watt from both facets) and nearly diffraction-limited optical output. The reference states that "[f] or many semiconductor laser applications such as solid-state laser end pumping . . . , single-lobed, diffraction limited beams of hundreds of milliwatts are required." Coupling the optical output from such an unstable resonator into a solid-state laser is described in U.S. Pat. No. 5,260,963 of Baird and DeFreez for Method and Apparatus for Efficient Operation of a Solid-State Laser Optically Pumped by an Unstable Resonator Semiconductor Laser, which is assigned to assignee of the present invention and is herein incorporated by reference.

Many important laser applications require laser operation at visible or ultraviolet wavelengths. Moreover, a compact source of coherent visible or ultraviolet light output suitable for use in hospital operating rooms and similar medical environments is also highly desirable for use in a wide range of medical treatments, such as photo-activation of therapeutic drugs.

A variety of methods have been described for generating laser output in the 400 nm to 600 nm wavelength range from solid-state lasers and diode lasers by utilizing the nonlinear process of second-harmonic generation (SHG). For example, several methods have been described for producing SHG laser output in the 520–540 nm wavelength range from diode-pumped, solid-state lasers containing a neodymium-doped lasant. Baer, et al. in U.S. Pat. No. 4,653,056 describe one such method in which an AlGaAs diode laser end-pumps a solid-state laser resonator containing a neodymium-doped yttrium aluminum garnet (Nd:YAG) rod and potassium titanium phosphate (KTP) nonlinear crystal to produce SHG laser output at 532 nm. As described in "Second Harmonic and Sum-Frequency Generation to 4950 and 4589 A° in KTP," *IEEE Journal of Quantum Electronics*, vol. QE-24, No. 1 (January 1988), such bulk KTP crystals are phase-matchable for type-2 second-harmonic generation down to 495 nm. To generate SHG wavelengths shorter than 495 nm, other bulk nonlinear materials are required.

Kozlovsky, et al. in "Efficient Second Harmonic Generation of a Diode-Laser-Pumped CW Nd:YAG Laser Using Monolithic MgO:LiNbO$_3$ External Resonant Cavities," *IEEE Journal of Quantum Electronics*, vol. 24, No. 6 (June 1988), describe producing about 30 mW of SHG output at 532 nm by using a diode-pumped Nd:YAG, single-mode ring laser operating at 1064 nm to pump an external monolithic cavity of nonlinear magnesium oxide:lithium niobate (MgO:LiNbO$_3$).

Another method of producing SHG laser output at 532 nm is described by Schutz, et al. in "Miniature Self-Frequency-Doubling CW Nd:YAB Laser Pumped by a Diode-Laser," in *Optics Communications*, vol. 77, No. 2, 3 (15 Jun. 1990). Schutz, et al. describe producing a SHG output of about 10 mW at 532 nm by end-pumping a laser resonator containing the self-frequency-doubling lasant neodymium:yttrium aluminum boron (Nd:YAB) with 870 mW emitted by a AlGaAs diode laser array operating at an output wavelength of 807 nm.

Risk and Lenth in "Room-Temperature, Continuous-Wave, 946-nm Nd:YAG Laser Pumped by Laser-Diode Arrays and Intracavity Frequency Doubling to 473 nm," *Optics Letters*, Vol. 12, No. 12 (December 1987), describe a method to pump a 1 mm length rod of Nd:YAG with two 0.25 W diode laser arrays whose output are combined using a polarizing beamsplitter cube arrangement. The method employs a 5 mm long crystal of lithium iodate ($LiIO_3$) cut for Type I phased-matched frequency doubling of 946 nm output at room temperature in the solid-state laser resonator cavity and produces approximately 100 µW of SHG blue light at 473 nm. Risk, Pon, and Lenth in "Diode Laser Pumped Blue-Light Source at 473 nm Using Intracavity Frequency Doubling of a 946 nm Nd:YAG Laser," *Applied Physics Letters*, vol 54, No. 17 (24 Apr. 1989), describe further work on a similar method employing a single 0.5 W laser diode to end-pump a solid-state laser resonator containing a 1 mm long Nd:YAG rod and a 3.7 mm long potassium niobate ($KNbO_3$) nonlinear crystal to produce. 3.1 mW of blue output at 473 nm.

Methods have also been described in which the laser output from diode lasers are directly frequency doubled. Kozlovsky, et al. describes such a method in "Generation of 41 mW of Blue Radiation by Frequency Doubling of a GaAlAs Diode Laser," *Applied Physics Letters*, vol. 56, No. 23, (4 Jun. 1990). They employ a monolithic ring resonator of $KNbO_3$ to convert 105 mW of incident diode laser power at 856 nm to 41 mW of blue 428 nm output power. The room-temperature wavelength limit for non-critical phase-matching in $KNbO_3$ of about 860 nm is likely to prevent SHG wavelengths significantly shorter than the wavelengths they describe from being produced using $KNbO_3$ and similar methods.

In "Blue Second Harmonic Generation in KTP, $LiNbO_3$ and $LiTaO_3$ Waveguides," *Phillips Journal of Research*, vol. 46, 231–265 (1992), Jongerius, et al. describe conversion of an infrared pump beam into a blue beam by SHG through coupling the pump beam into channel waveguides that have been diffused into the surface of KTP, $LiNbO_3$, or lithium tantalate ($LiTaO_3$) substrates. They describe achieving 6 mW of 460 nm output power from a periodically segmented domain-inverted KTP waveguide by pumping the waveguide with 920 nm output from a Ti:Sapphire solid-state laser.

It would be desirable to find a method to produce a compact, diode-pumped solid-state laser that can produce higher power visible or ultraviolet laser output in the 350–550 nm range using the nonlinear process of SHG. For example, improved methods for coupling the optical output of high-power diode lasers, especially those having improved lateral spatial coherence such as an unstable resonator semiconductor laser, into the mode volumes of a solid-state lasant such as Cr:LiCAlF or Cr:LiSAF are highly desirable. Such methods for pumping CR:LiCAlF or CR:LiSAF to ultimately produce usable frequency-doubled optical output in the 360–460 nm range are described in detail in copending U.S. patent application Ser. No. 07/873,408 of Baird and DeFreez for High Power, Compact, Diode-Pumped, Tunable Laser, which is assigned to assignee of the present invention and herein incorporated by reference.

SUMMARY OF THE INVENTION

An object of the present invention is, therefore, to provide a compact laser.

Another object of the invention is to provide an unstable resonator semiconductor diode laser (URSL) capable of generating very bright output that can be collected and focused using conventional lenses into an optical frequency-converting device such as an optical nonlinear waveguide.

Yet another object of the invention is to provide such an URSL that generates a pumping beam having a preselected narrow wavelength range and excellent spatial overlap with respect to the mode volume of the nonlinear waveguide.

Still another object of the invention is to provide a method for coupling infrared laser output within the 700–1100 nm range generated by such an unstable resonator semiconductor laser into a nonlinear waveguide in order to convert the infrared output beam to a visible or near ultraviolet output beam within the 350–550 nm range by utilizing the nonlinear process of second-harmonic generation (SHG).

And yet another object of the invention is to employ the laser output power generated by such methods to process electronic materials, such as resistor paste and photoresists, to photo-activate drugs sensitive at these wavelengths for use in therapeutic medical applications, or to read and record information in high density optical disk systems.

In a preferred embodiment of the present invention, optical output of greater than 50 mW in the 720–880 nm range is generated by a broad area, high-power AlGaAs unstable resonator semiconductor laser that incorporates a distributed feedback grating or a distributed Bragg reflectors. The optical output is then directed into a periodically segmented domain-inverted KTP waveguide to produce an output beam of greater than 1 mW in the 360–440 nm wavelength range. High power output at 385 nm may, for example, be employed to photo-activate 8-methoxypsoralen in the treatment of restenosis caused by accelerated atherosclerosis.

Additional objects and advantages of the present invention will be apparent from the following detailed description of the preferred embodiments thereof, which proceeds with reference to the accompanying drawings.

DETAILED DESCRIPTION OF PREFERRED EMBODIMENTS

Figure 1:
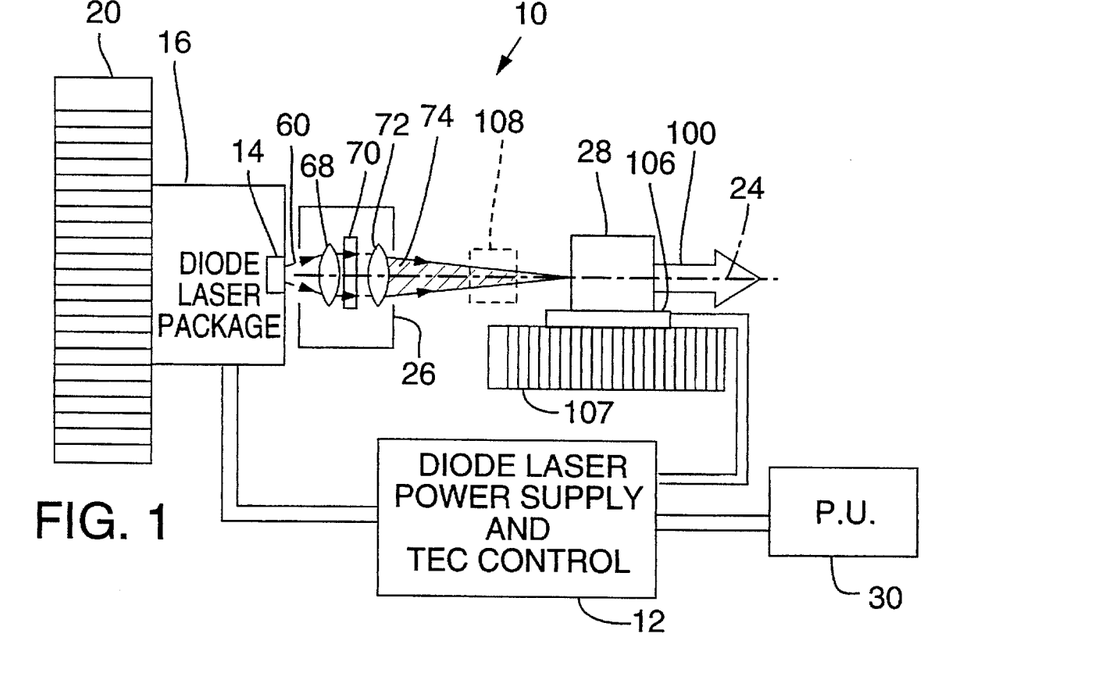
FIG. 1 is a partly schematic plan illustration of a laser system incorporating an unstable resonator semiconductor laser (URSL), a lens system, and a nonlinear waveguide in accordance with a preferred embodiment of the present invention.
Figure 2A:
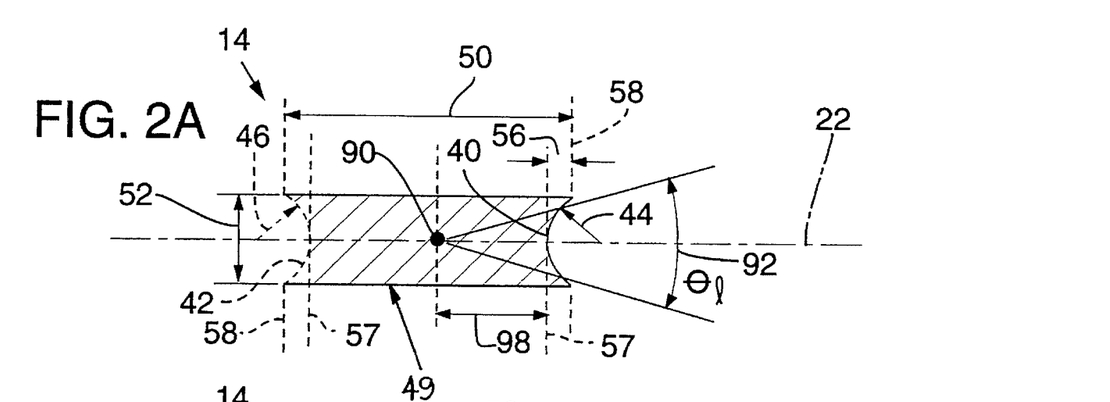
FIGS. 2A and 2B are respective enlarged plan and side elevation illustrations of an URSL incorporated in the laser system of FIG. 1.
Figure 2B:
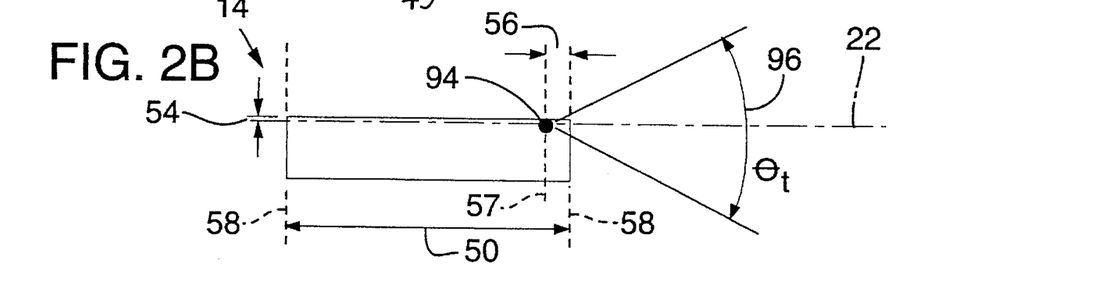

With reference to FIGS. 1, 2A, and 2B, laser system 10 preferably includes a power supply and thermal electric cooling (TEC) control 12 for supplying electrical current to a high-power, unstable resonator semiconductor laser (URSL) 14 with an optical output of greater than 50 mW in the 700–1100 nm wavelength range. High-power URSL 14 forms part of a diode laser package 16 that is connected to a heat sink 20. High-power URSL 14 is positioned so that its optic axis 22 (FIGS. 2A and 2B) is preferably coaxial to an optic axis 24 extending through lens system 26 and nonlinear waveguide 28. A processing unit (PU) 30 determines the power level and other signal levels supplied by power supply 12 to high-power URSL 14.

With reference to FIGS. 2A and 2B, high-power URSL 14 can be fabricated by focused ion beam micromachining, as described in Tilton, . . . DeFreez, et al., of one or both mirrors 40 and 42 to provide mirror surfaces with respective radii of curvature 44 and 46 such that the combination of mirror curvatures 44 and 46 imparts a greater than unity lateral magnification to an optical field propagating within high-power URSL 14. For example, high-power URSL 14 may be a broad-area, high-power AlGaAs semiconductor diode laser that typically emits at wavelengths in the range 700 nm to 880 nm. Such a high-power URSL 14 may have a resonator 49 of a cavity length 50 of 500 µm, an active area width 52 of 200 µm, an active area thickness 54 of 0.005–0.2 µm, and a mirror 42 with a circular radius of curvature 46 of infinity. Mirror 40 of 300 µm of such a high-power URSL 14 may be micromachined to have a circular radius of curvature 44 of 2200 µm with maximum sag depth 56 of 5.1 µm along URSL optical axis 22 between unmachined mirror plane 58 and axis 57 that defines an end of resonator 49 along URSL optical axis 22. Such a high-power URSL 14 may have a resonator magnification of 2.5. URSL 14 may, for example, generate optical output 60 of greater than 50 mW or of even greater than 1 W.

Unlike conventional high-power diode lasers and arrays of diode lasers used for pumping nonlinear waveguides, high-power URSL 14 exhibits lateral spatial coherence as well as transverse spatial coherence. This improvement in spatial coherence results in high-power URSL 14 generating a high-power optical output 60 that can be efficiently collected by a lens system 26 that typically includes a collimating lens 68 and a cylindrical lens 70. Optical output 60 is subsequently focused by an objective lens 72 to form a waveguide pumping beam 74 that has its radius and depth of focus selected to be well-matched to the optical mode of nonlinear waveguide 28.

Analyses suggest that adjustments to the radii of curvature 44 and 46 of the respective mirrors 40 and 42, in combination with adjustments to the cavity length 50, can modify lateral divergence angle 92 originating from virtual point source 90 in the lateral plane to make angle 92 substantially equal to transverse divergence angle 96 originating from real point source 94 in the transverse plane of high-power URSL 14. Such adjustments may also modify the resonator manification.

With reference again to FIG. 1, nonlinear waveguide 28 is preferably selected from, but not limited to, periodically segmented domain-inverted KTP waveguide, periodically segmented domain-inverted $LiNbO_3$, and periodically segmented domain-inverted $LiTaO_3$. Nonlinear waveguide 28 is mechanically oriented in a mount (not shown) such that the polarization direction of waveguide pumping beam 74 is in correct orientation to be confined within waveguide 28. A periodically segmented domain-inverted KTP waveguide 28 is preferred to convert the infrared waveguide pumping beam 74 from the wavelength range 720 to 920 nm to a visible or near ultraviolet output beam 100 operating in the wavelength range 360 to 460 nm by utilizing the nonlinear process of second-harmonic generation. Output beam 100 may, for example, have an output power of greater than 1 mW or of even greater than 10 mW.

The efficiency with which the optical power of the waveguide pumping beam 74 is converted into optical power of the SHG output beam 100 can be optimized by selection of the radius and spectral bandwidth of the waveguide pumping beam 74 to best match a selected segmentation period, waveguide length, and waveguide width as described by Jongerius, et al.

Figure 3A:
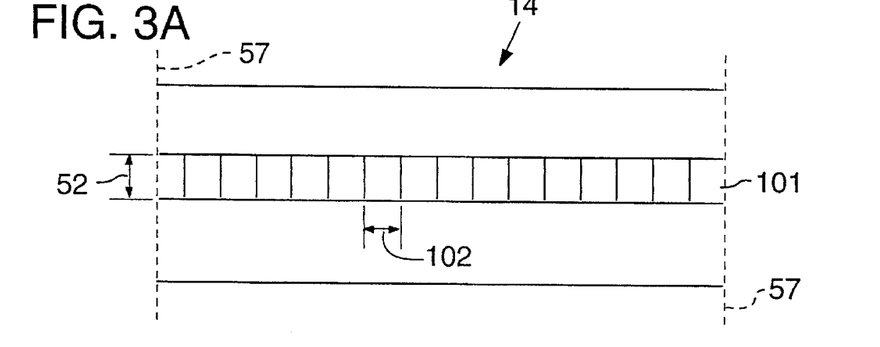
FIGS. 3A and 3B are respective enlarged plan and side elevation illustrations of a distributed feedback (DFB) grating URSL.
Figure 3B:
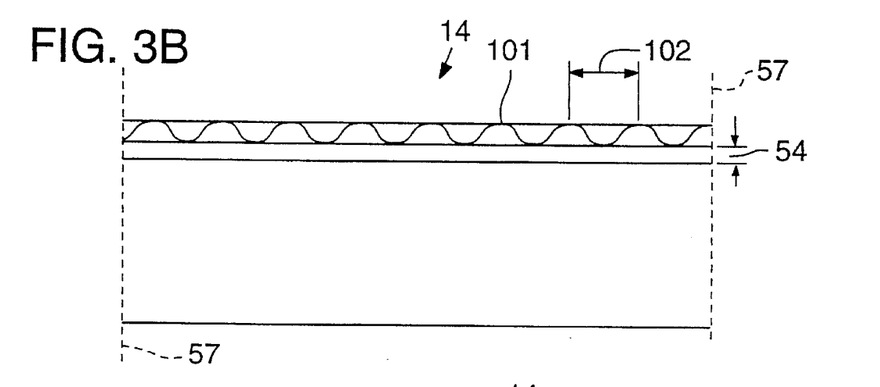

FIGS. 3A and 3B are respective plan and side elevation illustrations of and URSL 14 (shown without curved mirrors 40 and 42 for convenience) containing a distributed feedback grating (DFB) 101. For convenience, certain elements in FIGS. 3A and 3B are labeled with reference numerals that correspond to similar elements in FIGS. 2A and 2B even though these elements may not be identical in dimension or composition to those of the previous figures.

With reference to FIGS. 3A and 3B, a preferred embodiment of URSL 14 is fabricated to include a narrow, approximately 3 µm wide, second order DFB grating 101 along optic axis 22 of URSL 14 for the purpose of controlling the spectral bandwidth and wavelength output of waveguide pumping beam 74. DFB grating 101 can be fabricated by using the method of holographic lithography. The preferred uniform grating period 102 for operation of URSL optical output 60 at 770 nm is approximately 220 nm. Those skilled in the art will recognize that DFB gratings 101 with periods 102 as small as 180 nm can be fabricated using the 351 nm line of an argon ion laser. Skilled persons will also recognize that DFB grating 101 may have a width equal to that of active area width 52 or may be selected to have other desirable widths. Use of a second order DFB grating 101 has an advantage over use of a first order grating because the second order eliminates the degeneracy of the two longitudinal modes that are typical of an ideal DFB laser with a first order grating, and thus may allow higher yield production of single longitudinal mode URSL devices.

DFB grating period 102 may alternatively be of the first order type for operation of URSL optical output 60 at 770 nm. The preferred first order DFB grating period 104 would be approximately 110 nm. Yen, et al. in "Optically Pumped GaAs Waveguide Lasers with Fundamental 0.11 Micron Corrugation Feedback" have demonstrated that such first order DFB gratings are suitable for use in GaAs waveguide diode lasers. Persons skilled in the art will realize that numerous other embodiments are possible by varying the order and period of DFB grating 101.

Figure 4A:
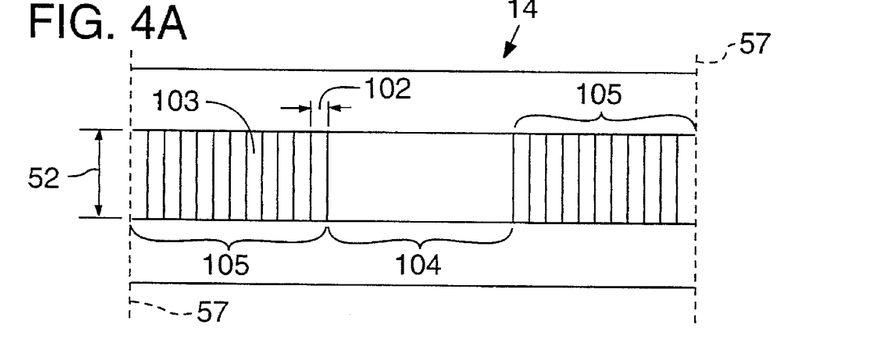
FIGS. 4A and 4B are respective enlarged plan and side elevation illustrations of a distributed Bragg reflector (DBR) URSL.
Figure 4B:
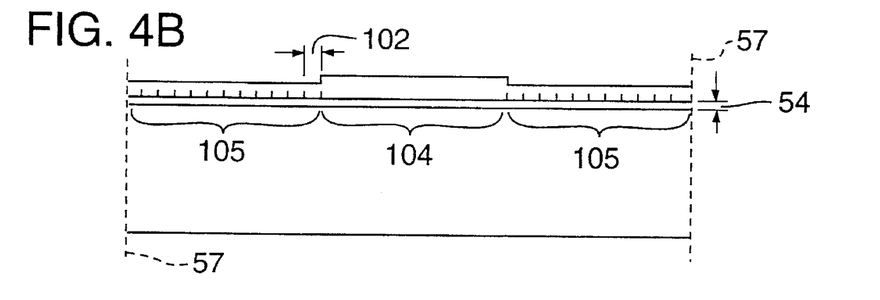

With reference to FIGS. 4A and 4B, URSL 14 (shown without curved mirrors 40 and 42 for convenience) may alternatively comprise a distributed Bragg reflector (DBR) 103. Some elements in FIGS. 4A and 4B are labelled with reference numerals that correspond to similar elements in FIGS. 2A, 2B, 3A, and 3B even though these elements may not be identical in dimension or composition to those of the previous figures. DBR 103 preferably includes a nongrating region 104 and two grating regions 105 having periods 102.

The wavelength of optical output 60 of URSL 14 can further be electronically controlled by TEC control 12 through adjustment of the temperature of URSL 14 allowing a temperature tuning of the wavelength of approximately 1 angstrom/degree centigrade. This temperature tuning adjustment allows the wavelength of waveguide pumping beam 74 to be precisely matched to the spectral acceptance bandwidth of nonlinear waveguide 28 to yield efficient SHG optical output 100.

The center wavelength of the spectral acceptance bandwidth of nonlinear waveguide 28 can also be finely controlled by TEC control 12 through adjustment of thermoelectric cooler (TEC) 106 which controls the temperature of nonlinear waveguide 28. This control is accomplished through temperature tuning of the SHG phase-matching conditions of nonlinear waveguide 28. Fine control of the temperature of nonlinear waveguide 28 is also helpful in obtaining stable SHG output beam 100. Thermoelectric cooler may be connected to a heat sink 107.

Skilled persons will also appreciate that in order to stabilize the wavelength of optical output 60, a Faraday isolator 108 may optionally be inserted into the waveguide pumping beam 74 to inhibit possible undesirable retroreflections from nonlinear waveguide 28 from inducing longitudinal mode-hopping effects or spectral coherence collapse in the optical output 60 of URSL 14.

Figure 5:
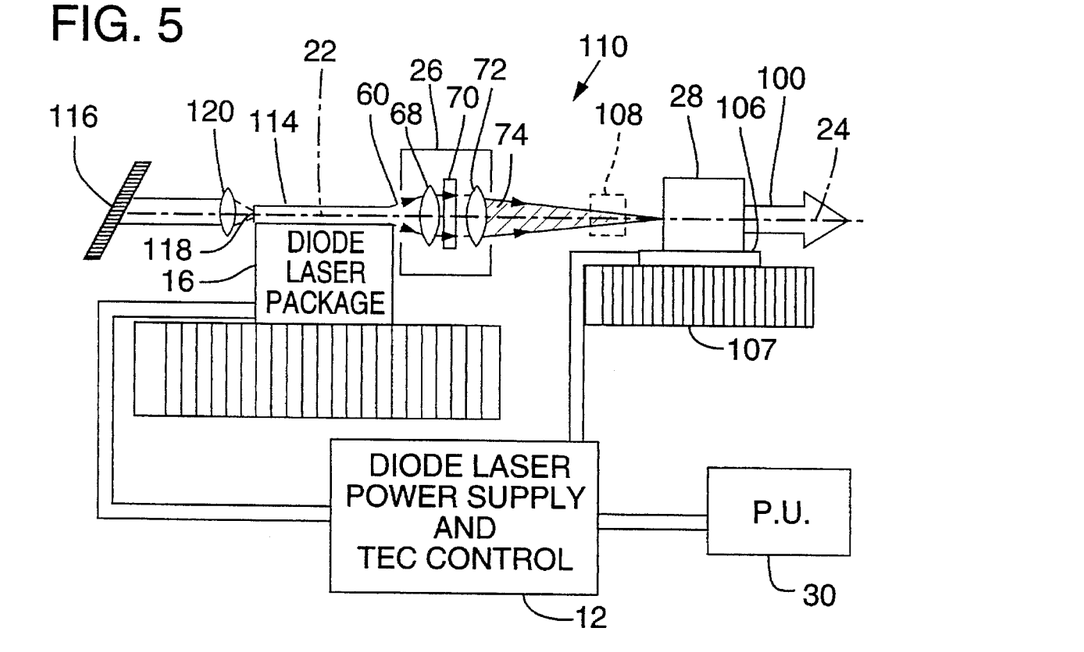
FIG. 5 is an alternative embodiment of the laser system of FIG. 1, employing a non-DFB URSL and a grating mirror.

FIG. 5 depicts an alternative embodiment of a laser system 110 of the present invention that employs a non-DFB URSL 114 and a grating mirror 116 for purpose of controlling the spectral bandwidth and wavelength of URSL optical output 60. For convenience, certain elements of laser system 110 are labeled with reference numerals that correspond to analogous elements in laser system 10 of FIG. 1. Although these elements may not be identical in dimension or composition, their functional descriptions will be omitted in the interest of brevity.

In the embodiment presented in FIG. 5, grating mirror 116 is positioned along a portion of optic axis 24 that extends from rear facet 118 of URSL 114. Grating mirror 116 is oriented to preferentially, as is well known to those skilled in the art, select a specific frequency of light to be retroreflected towards URSL 114. A collimating lens 120 is positioned between rear facet 118 of URSL 114 and grating mirror 116 is to efficiently collect the light reflected from grating mirror 116 toward rear facet 118. The retroreflected light is directed by collimating lens 120 towards the active area of URSL 114 thereby acting to preferentially select a single longitudinal frequency to oscillate within URSL 114. The wavelength selected for feedback to URSL 114 by grating mirror 116 is chosen to coincide with the most desirable wavelength for waveguide pumping beam 74 for obtaining efficient SHG operation from nonlinear waveguide 28.

Figure 6:
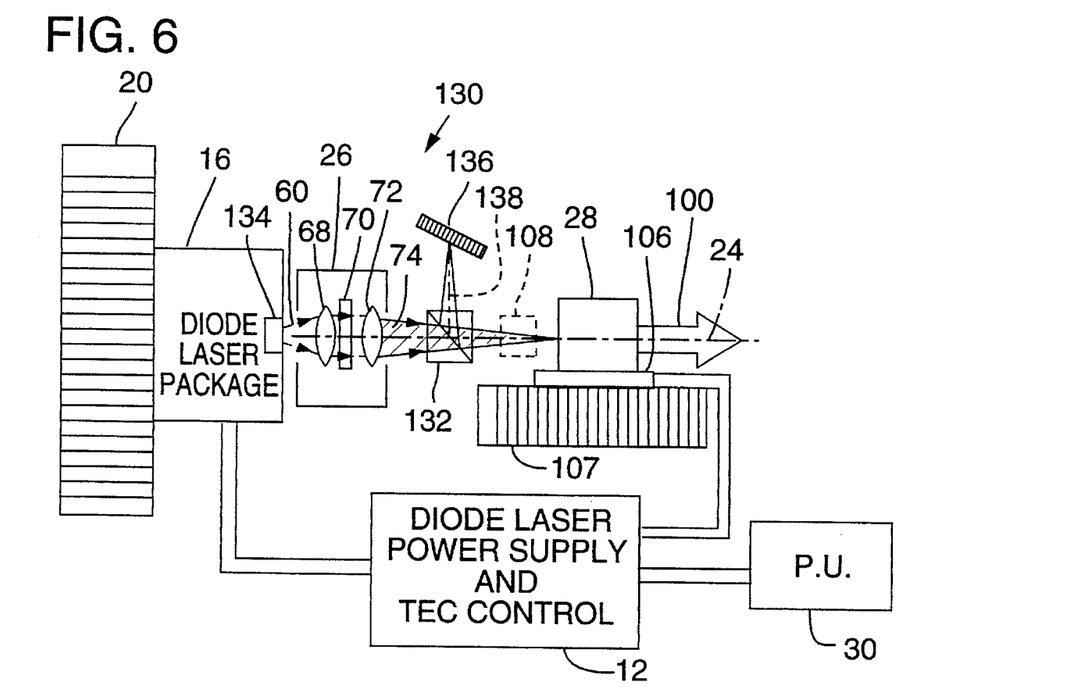
FIG. 6 is an alternative embodiment of the laser system of FIG. 1, employing a non-DFB URSL, a grating mirror, and a beamsplitter.

FIG. 6 depicts in another embodiment of the present invention, a laser system 130 that employs a beamsplitter 132 as well as a non-DFB URSL 134 and a grating mirror 136. Beamsplitter 132 directs a fraction of waveguide pumping beam 74 towards a grating mirror 136. Grating mirror 136 is oriented at an angle to optic axis 138 so as to reflect a specifically selected wavelength along optic axes 138 and 24 backwards to URSL 134.

For the purposes of controlling the radius of waveguide pumping beam 74, the effective focal length of lens assembly 26 can be selected to provide focused spot sizes of less than 10 μm. For example, optical output 60 may have a beam radius of 57–72 μm at lens assembly 26, which may be a single or double convex lens, and which then focuses optical output 60 to form waveguide pumping beam 74. Waveguide pumping beam 74 is typically focused to an approximately 5 μm spot size in nonlinear waveguide 28. Other methods known to the art may be employed to control the spectral bandwidth and waveguide pumping beam radius without departing from the scope of the present invention.

Skilled persons will appreciate that frequency converted URSL output may be employed to process electronic materials, such as resistor paste and photoresists, to photoactivate drugs sensitive at these wavelengths for use in therapeutic medical applications, or to read and record information in high density optical disk systems. High power output at 385 nm may, for example, be employed to photo-activate 8-methoxypsoralen in the treatment of restenosis caused by accelerated atherosclerosis.

The high power compact shorter wavelength laser systems of the present invention offer the advantage of using a shorter wavelength optical beam that permits a higher density of information to be stored on optical disks.

It will be obvious to those having skill in the art that various changes may be made in the details of the above-described embodiments of the present invention without departing from the underlying principles thereof. For example, high-power URSL 14 can be composed of other light-emitting semiconductor material such as InGaAsP, InGaAs, or AlGaInP. The scope of the present invention should be determined, therefore, only by the following claims.

We claim:

1. A method for generating frequency-converted laser optical output, comprising:

providing an unstable resonator semiconductor laser including a wavelength-selecting grating and a resonator having a length, a virtual point source in a lateral plane, a real point source in a transverse plane, and mirrors with radii of curvatures enclosing the resonator, the resonator length and the mirror radii of curvatures being selected to impart a greater than unity lateral magnification to an optical field propagating within the resonator and to make substantially equal a lateral divergence angle originating from the virtual point source to a transverse divergence angle originating from the real point source;

generating from the unstable resonator semiconductor laser an URSL optical output of greater than 50 mW with a high degree of lateral and transverse spatial coherence; and coupling the URSL optical output into a frequency-converting medium to convert the URSL optical output to frequency-converted laser optical output.

2. The method of claim 1 in which the unstable resonator semiconductor laser emits in a wavelength range of 700–1000 nm.

3. The method of claim 2 in which the unstable resonator semiconductor laser comprises AlGaAs that emits at about 700–880 nm.

4. The method of claim 1 further comprising:

selecting the wavelength of the laser optical output.

5. The method of claim 1 further comprising:

employing a grating mirror that is external to the unstable resonator semiconductor laser to select the wavelength of the URSL optical output.

6. The method of claim 1 in which the wavelength-selecting grating comprises a distributed feedback grating to select the wavelength of the URSL optical output.

7. The method of claim 6 in which the distributed feedback grating employs a first order period.

8. The method of claim 6 in which the distributed feedback grating employs a second order period.

9. The method of claim 6 in which the distributed feedback grating is fabricated into the unstable resonator semiconductor laser by a process of holographic lithography.

10. The method of claim 1 in which the wavelength-selecting grating comprises a distributed Bragg reflector to select the wavelength of the URSL optical output.

11. The method of claim 1 in which the frequency-converting medium comprises a nonlinear waveguide.

12. The method of claim 11 in which the nonlinear waveguide comprises periodically segmented domain-inverted KTP, $LiNbO_3$, or $LiTaO_3$.

13. The method of claim 1 in which the frequency-converted laser optical output has a usable wavelength component within the 350–500 nm range.

14. The method of claim 13 in which the usable wavelength component is about 385 nm.

15. The method of claim 1 in which the high-power unstable resonator semiconductor laser generates single frequency URSL optical output.

16. The method of claim 1 in which the optical field propagating within the resonator has a lateral magnification of greater than 2.5.

17. A laser system for generating frequency-converted laser system optical output, comprising:

a high-power unstable resonator semiconductor laser for generating an URSL optical output of greater than 50 mW, the unstable resonator semiconductor laser including a wavelength-selecting grating and a resonator having a length, a virtual point source in a lateral plane, a real point source in a transverse plane, and mirrors with radii of curvatures enclosing the resonator, the resonator length and the mirror radii of curvatures being selected to impart a greater than unity lateral magnification to an optical field propagating within the resonator and to make substantially equal a lateral divergence angle originating from the virtual point source is to a transverse divergence angle originating from the real point source to provide the URSL optical output with a high degree of lateral and transverse spatial coherence; and a frequency-converting medium for converting the URSL optical output to frequency-converted laser system optical output.

18. The laser system of claim 17 in which the unstable resonator semiconductor laser emits in a wavelength range of 700–1000 nm.

19. The laser system of claim 17 in which the unstable resonator semiconductor laser comprises AlGaAs that emits at about 700–880 nm.

20. The laser system of claim 17 further comprising a wavelength-selecting element for selecting the wavelength of the laser system optical output.

21. The laser system of claim 17 in which the frequency-converting medium comprises a nonlinear waveguide.

22. The laser system of claim 21 in which the nonlinear waveguide comprises periodically segmented domain-inverted KTP, $LiNbO_3$, or $LiTaO_3$.

23. The laser system of claim 17 in which the laser system optical output is greater than 1 mW.

24. The laser system of claim 17 further comprising a grating mirror that is external to the unstable resonator semiconductor laser.

25. The laser system of claim 17 in which the wavelength-selecting grating comprises a distributed feedback grating.

26. The laser system of claim 25 in which the distributed feedback grating employs first order period.

27. The laser system of claim 25 in which the distributed feedback grating employs a second order period.

28. The laser system of claim 25 in which the unstable resonator semiconductor laser emits in a wavelength range of 700–1000 nm.

29. The laser system of claim 25 in which the distributed feedback grating is fabricated into the unstable resonator semiconductor laser by a process of holographic lithography.

30. The laser system of claim 17 in which the wavelength selecting grating comprises a distributed Bragg reflector to select the wavelength of the URSL optical output.

31. The laser system of claim 17 in which the frequency-converted laser optical output has a usable wavelength component within the 350–440 nm range.

32. The laser system of claim 31 in which the usable wavelength component is about 385 nm.

33. The laser system of claim 17 in which the high-power unstable resonator semiconductor laser generates single frequency URSL optical output.

34. The system of claim 17 in which the optical field propagating within the resonator has a lateral magnification of greater than 2.5.

35. A method for generating frequency-converted laser optical output, comprising:

providing an unstable resonator semiconductor laser for generating an URSL optical output at a wavelength within a wavelength range of 700–1000 nm, the unstable resonator semiconductor laser including a resonator having a length, a virtual point source in a lateral plane, a real point source in a transverse plane, and mirrors with radii of curvatures enclosing the resonator, the resonator length and the mirror radii of curvatures being selected to impart a greater than unity lateral magnification to an optical field propagating within the resonator and to make substantially equal a lateral divergence angle originating from the virtual point source to a transverse divergence angle originating from the real point source;

generating the URSL optical output of greater than 50 mW from the unstable resonator semiconductor laser; and coupling the URSL optical output into a frequency-converting medium to convert the URSL optical output to frequency-converted laser optical output at a wavelength within a wavelength range of 350–500 nm.

36. The method of claim 35 further comprising providing a wavelength-selecting element to select the wavelength within the 700–1000 nm wavelength range.

37. The method of claim 36 in which the wavelength-selecting element comprises a distributed feedback grating.

38. The method of claim 36 in which the wavelength-selecting element comprises a distributed Bragg reflector.

39. The method of claim 36 in which the wavelength-selecting element comprises a grating mirror that is external to the unstable resonator semiconductor laser.

40. The method of claim 35 in which the frequency-converting medium comprises a nonlinear waveguide comprising periodically segmented domain-inverted KTP, $LiNbO_3$, or $LiTaO_3$.

41. The method of claim 35 in which the optical field propagating within the resonator has a lateral magnification of greater than 2.5.

42. A laser system for generating frequency-converted laser system optical output, comprising:

a high-power unstable resonator semiconductor laser for generating an URSL optical output of greater than 50 mW at a unstable resonator semiconductor laser including a resonator having a length, a virtual point source in a lateral plane, a real point source in a transverse plane, and mirrors with radii of curvatures enclosing the resonator, the resonator length and the mirror radii of curvatures being selected to impart a greater than unity lateral magnification to an optical field propagating within the resonator and to make substantially equal a lateral divergence angle originating from the virtual point source to a transverse divergence angle originating from the real point source; and a frequency-converting medium for converting the URSL optical output to frequency-converted laser system optical output at a wavelength within a wavelength range of 350–500 nm.

43. The laser system of claim 42 further comprising a wavelength-selecting element to select the wavelength within the wavelength range of 700–1000 nm.

44. The laser system of claim 43 in which the wavelength-selecting element comprises a distributed feedback grating fabricated into the unstable resonator semiconductor laser.

45. The laser system of claim 43 in which the wavelength-selecting element comprises a distributed Bragg reflector fabricated into the unstable resonator semiconductor laser.

46. The laser system of claim 43 in which the wavelength-selecting element comprises a grating mirror that is external to the unstable resonator semiconductor laser.

47. The laser system of claim 42 in which the frequency converting medium comprises a nonlinear waveguide.

48. The laser system of claim 47 in which the nonlinear waveguide comprises periodically segmented domain-inverted KTP, $LiNbO_3$, or $LiTaO_3$.

49. The laser system of claim 42 in which the laser system optical output is greater than 1 mW.

50. The system of claim 42 in which the optical field propagating within the resonator has a lateral magnification of greater than 2.5.

* * * * *

UNITED STATES PATENT AND TRADEMARK OFFICE
CERTIFICATE OF CORRECTION

PATENT NO. : 5,559,824
DATED : September 24, 1996
INVENTOR(S) : BRIAN BAIRD and RICHARD DeFREEZ It is certified that error appears in the above-indentified patent and that said Letters Patent is hereby corrected as shown below:

Column 3, line 29, delete "." after "produce".

Column 4, lines 36-37, change "reflectors" to --reflector--.

Column 7, line 44, delete "is" after "116".

Column 11, line 3, claim 42, line 5, before "unstable" insert -- wavelength within a wavelength range of 700-1000 nm, the--.

Signed and Sealed this

Eighteenth Day of February, 1997

Attest:

BRUCE LEHMAN

*Attesting Officer*   *Commissioner of Patents and Trademarks*